US006791340B2

(12) United States Patent
Hasbani

(10) Patent No.: US 6,791,340 B2
(45) Date of Patent: Sep. 14, 2004

(54) DEVICE FOR THE COMPARISON OF TWO RESISTORS, AND INTEGRATED RESISTOR COMPENSATION SYSTEM INCORPORATING THIS DEVICE

(75) Inventor: Frédéric Hasbani, Laval (FR)

(73) Assignee: STMicroelectronics SA, Montrouge (FR)

( * ) Notice: Subject to any disclaimer, the term of this patent is extended or adjusted under 35 U.S.C. 154(b) by 103 days.

(21) Appl. No.: 10/171,086

(22) Filed: Jun. 12, 2002

(65) Prior Publication Data

US 2003/0001594 A1 Jan. 2, 2003

(30) Foreign Application Priority Data

Jun. 12, 2001 (FR) .............................. 0107666

(51) Int. Cl.$^7$ ............................................. G01R 27/04
(52) U.S. Cl. .......................... 324/647; 327/276; 326/83
(58) Field of Search ....................... 324/647; 327/276, 327/270; 326/83, 30

(56) References Cited

U.S. PATENT DOCUMENTS

| 3,784,906 | A |   | 1/1974  | Ironside .................... 324/62  |
| 5,115,188 | A |   | 5/1992  | Norton ....................... 323/365 |
| 5,666,078 | A | * | 9/1997  | Lamphier et al. ............ 327/108 |
| 6,157,215 | A | * | 12/2000 | Gabara et al. ................ 326/83  |
| 6,166,563 | A | * | 12/2000 | Volk et al. ..................... 326/87  |
| 6,384,621 | B1 | * | 5/2002  | Gibbs et al. ................... 326/30  |
| 6,445,245 | B1 | * | 9/2002  | Schultz et al. ............... 327/541 |
| 6,489,837 | B2 | * | 12/2002 | Schultz et al. ............... 327/541 |
| 6,541,996 | B1 | * | 4/2003  | Rosefield et al. ............. 326/30  |
| 6,573,777 | B2 | * | 6/2003  | Saint-Laurent et al. ..... 327/276 |

FOREIGN PATENT DOCUMENTS

DE         19625703     1/1998     ........... G01R/17/12

OTHER PUBLICATIONS

Gabara et al., Digitally Adjustable Resistors in CMOS for High–Performance Applications, Journal of Solid–State Circuits, New York, vol. 27, No. 8, Aug. 1, 1992, pp. 1176–1185.

* cited by examiner

Primary Examiner—Charles H. Nolan, Jr.
(74) Attorney, Agent, or Firm—Lisa K. Jorgenson; Allen, Dyer, Doppelt, Milbrath & Gilchrist, P.A.

(57) ABSTRACT

A device for the comparison of two resistors is based upon analog information carried by currents. The device includes a measurement circuit for extracting the currents from the two resistors to be compared, and copies the currents to a parallel analog-digital converter that carries out the division of the extracted currents. The device converts the ratio of the extracted currents into a digital code that is the image of the ratio of the two resistors. The ratio is constantly re-updated as a function of environmental parameters of the circuit, such as the operating temperature. Also disclosed is a system for correcting the value of integrated compensated resistors. The system implements a device of this kind that does not use a reference voltage generator.

37 Claims, 3 Drawing Sheets

DEVICE FOR THE COMPARISON OF TWO RESISTORS, AND INTEGRATED RESISTOR COMPENSATION SYSTEM INCORPORATING THIS DEVICE

FIELD OF THE INVENTION

The present invention relates to a device for comparing the value of two resistors as well as to a system for the compensation of integrated resistors whose operating values may vary as a function of their environmental parameters, such as temperature and manufacturing quality.

BACKGROUND OF THE INVENTION

Integrated resistors on silicon are often required in the field of analog integrated circuits. These resistors may be manufactured by different methods using standard CMOS (Complementary Metal Oxide Semiconductor) technology. However, these integrated resistors have the drawback of being imprecise because of manufacturing variations between semiconductor wafers to be etched, and because of variations in the operating temperature of the circuit. These variations significantly affect the resistance value of the resistors.

In most cases, these integrated resistors cannot be replaced by resistors external to the integrated circuit encapsulation package because of the additional constraints imposed by these external resistors.

To begin with, a first constraint relates to the availability of circuit pins. Planning for a resistor outside the circuit means that one or even two pins of the circuit have to be monopolized for each external resistor. Furthermore, in radio frequency applications, it is not possible to consider implementing resistors external to the package because of the substantial parasitic self-inductive effects that occur at the pins of the package. These radio frequency termination constraints prevent the signal from being output to the external resistor and then from being input again into the package.

In general, the resistors must be placed as close as possible to the circuits that use them in order to minimize the capacitive and self-inductive parasitic effects which prove to be large at the silicon-package connections, and at the package-card connections. In addition, external resistors impose cost constraints.

One prior art approach for the precise adjustment of the value of an integrated resistor relative to its environmental parameters, especially in order to resolve the above-mentioned problem of dispersion due to manufacturing, includes making a resistor and then destroying part of it in an electrical testing environment by sandblasting or by laser, for example, so as to remove resistive material until the desired resistance value of the resistor is obtained.

However, this method of adjusting the value of the integrated resistor, although very precise, is both slow and costly. It is therefore not advantageous in a mass production environment. Furthermore, this approach only partially resolves the problem of achieving perfect control over the value of the integrated resistors used in a given circuit. Indeed, it in no way overcomes the problem of dispersion under temperature that occurs during operation of the circuit. This is another major cause of the variations in the value of the integrated resistors. This approach is therefore not entirely satisfactory in the context of the invention which seeks to obtain very high precision in the use of the integrated circuits.

SUMMARY OF THE INVENTION

In view of the foregoing background, an object of the present invention is to enable the precise adjustment of the value of an integrated resistor while mitigating the drawbacks of the prior art by overcoming variations in the manufacturing quality and variations in the temperature during operation of the circuit.

This and other objects, advantages and features according to the present invention are provided by the integration of several compensated resistors. Each compensated resistor comprises a nominal part and several parallel-connected correction resistors (known as compensation resistors). Their use, totally or partially, is as a function of the quality of manufacture of this type of resistor and of the operating temperature of the circuit into which they are integrated. The value of these compensated resistors are adjusted in comparison with a reference resistor external to the circuit.

The choice of the number of compensation resistors to be implemented to attain the desired value is thus constantly re-updated advantageously during the operation of the circuit by a cell integrated into the circuit. This cell is known as a compensation cell and it operates as a resistor comparison device.

The role of this comparison device is to give a digital code to all the compensated integrated resistors. This digital code is the image or reflection of a measurement of comparison between a measurement resistor integrated into the circuit and a reference resistor external to the circuit.

The invention therefore relates to a device for the comparison of two resistors, wherein no voltage reference is implemented and wherein the device uses only analog information carried by currents until they are digitized. The device comprises a measurement circuit that extracts the currents from the two resistors to be compared and copies them to a parallel analog-digital converter. The analog-digital converter performs the division of the extracted currents and converts the ratio of the extracted currents into a digital code. The digital code is the image of the ratio of the two resistors and is constantly re-updated as a function of environmental parameters of the circuit, such as the operating temperature.

The invention also relates to a system for the active correction of the value of compensated resistors integrated into a package based upon an external reference resistor. The values of the compensated resistors may be deliberately different, and moreover, subject to variations caused by the operating temperature and by the quality of manufacture of resistors of this type. Each compensated resistor comprises a nominal resistor and a plurality of parallel-connected correction resistors.

The system implements the comparison device according to the present invention for making a comparison between the value of the reference resistor and the value of a measurement resistor internal to the package. The measurement resistor is designed identically to the nominal part of each of the compensated resistors. The correction resistors are put individually into operation or into the off state as a function of the compensation digital code given by the comparison device so as to obtain the value of the desired compensated resistor.

BRIEF DESCRIPTION OF THE DRAWINGS

Other features and advantages of the present invention shall appear more clearly from the following description of an exemplary embodiment made with reference to the appended figures and given by way of a non-restrictive example. Of these figures.

DETAILED DESCRIPTION OF THE PREFERRED EMBODIMENTS

Figure 1:
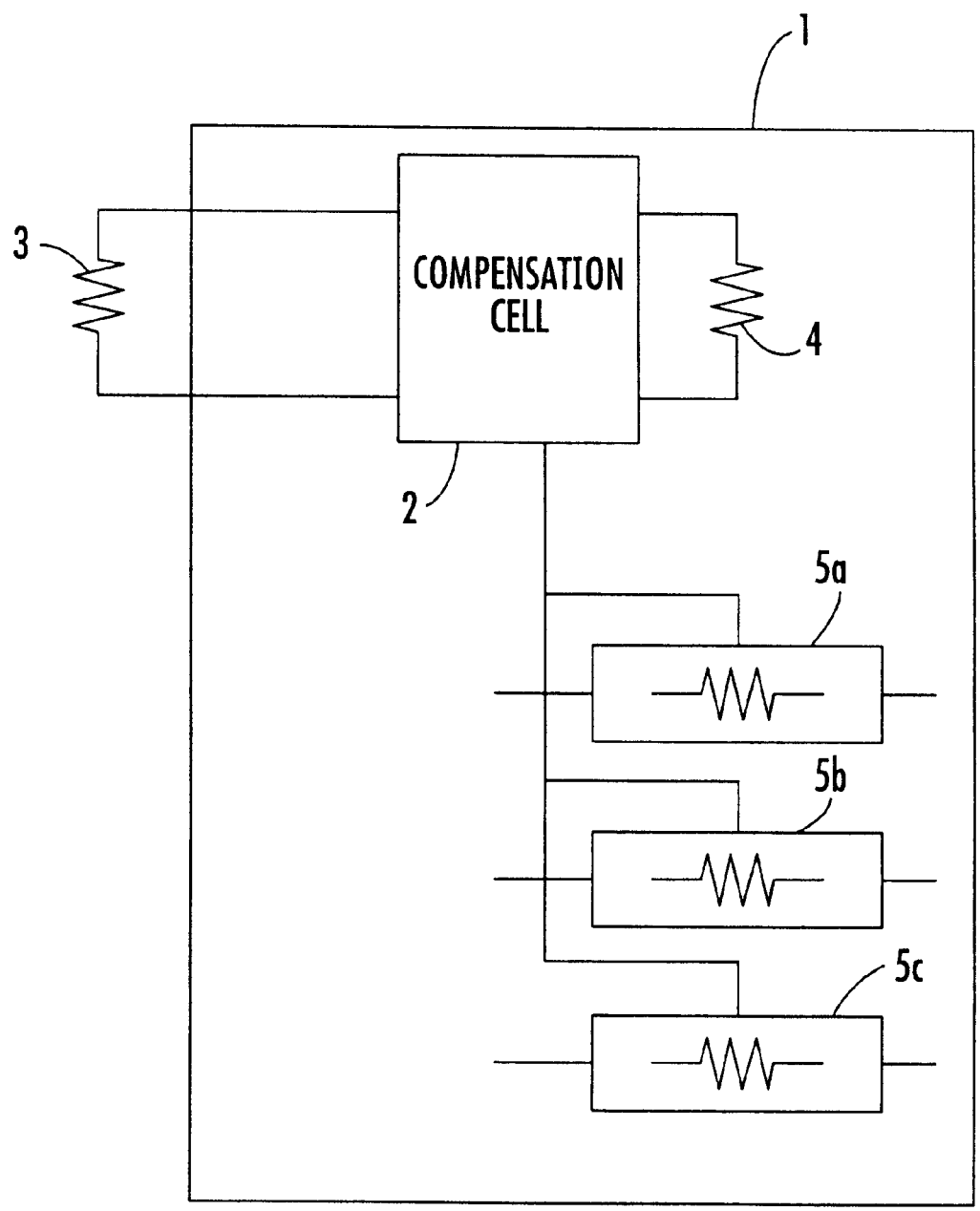
FIG. 1 is a diagram of an integrated resistor compensation system according to the present invention.

FIG. 1 shows a package 1 into which a compensation cell 2 is integrated. A resistor known as a reference resistor 3 is external to the package 1 and is connected to the two input terminals of the compensation cell 2. A resistor known as a measurement resistor 4 is integrated into the package and is connected to two additional input terminals of the compensation cell 2. The compensation cell 2 acts as a device for comparing the two resistors.

The compensation cell 2 is connected by its single output terminal, which is formed by a bus of several bits, to a set of compensated resistors integrated into the package 1. By way of an example, these resistors are shown in FIG. 1 as being three in number, respectively resistors 5a, 5b and 5c.

The compensation cell 2 carries out a comparison measurement between the value of the measurement resistor 4 internal to the package and that of the reference resistor 3 external to the package. The ratio of the values measured by the compensation cell 2 is then digitized and sent in binary code form to the different compensated resistors 5a, 5b, 5c integrated into the circuit.

The compensation cell 2 is sensitive only to the variations in resistance values, regardless of the cause. The comparison device 2 uses only analog information carried by the currents, as shall be seen further below with reference to the following figures. Thus, there is no need to provide for voltage references to make the comparison between the two resistors.

Each integrated compensated resistor 5a, 5b, 5c is formed by a nominal resistor and several parallel resistors that are individually put into operation or into an off state as a function of the compensation code given by the comparison cell 2. These different switchable resistors therefore act as corrective terms of the nominal resistance of each of the compensated resistors.

Each of the correction resistors is in fact designed to be switched at a known and predetermined level of temperature and for a known and predetermined quality of manufacture. Thus, in simulation, for a given ratio between the internal resistor known as a measurement resistor, and the external resistor known as a reference resistor, a compensation code is generated which then makes it possible to put at least one correction resistor into operation to obtain the total value of the desired compensated resistor.

Figure 2:
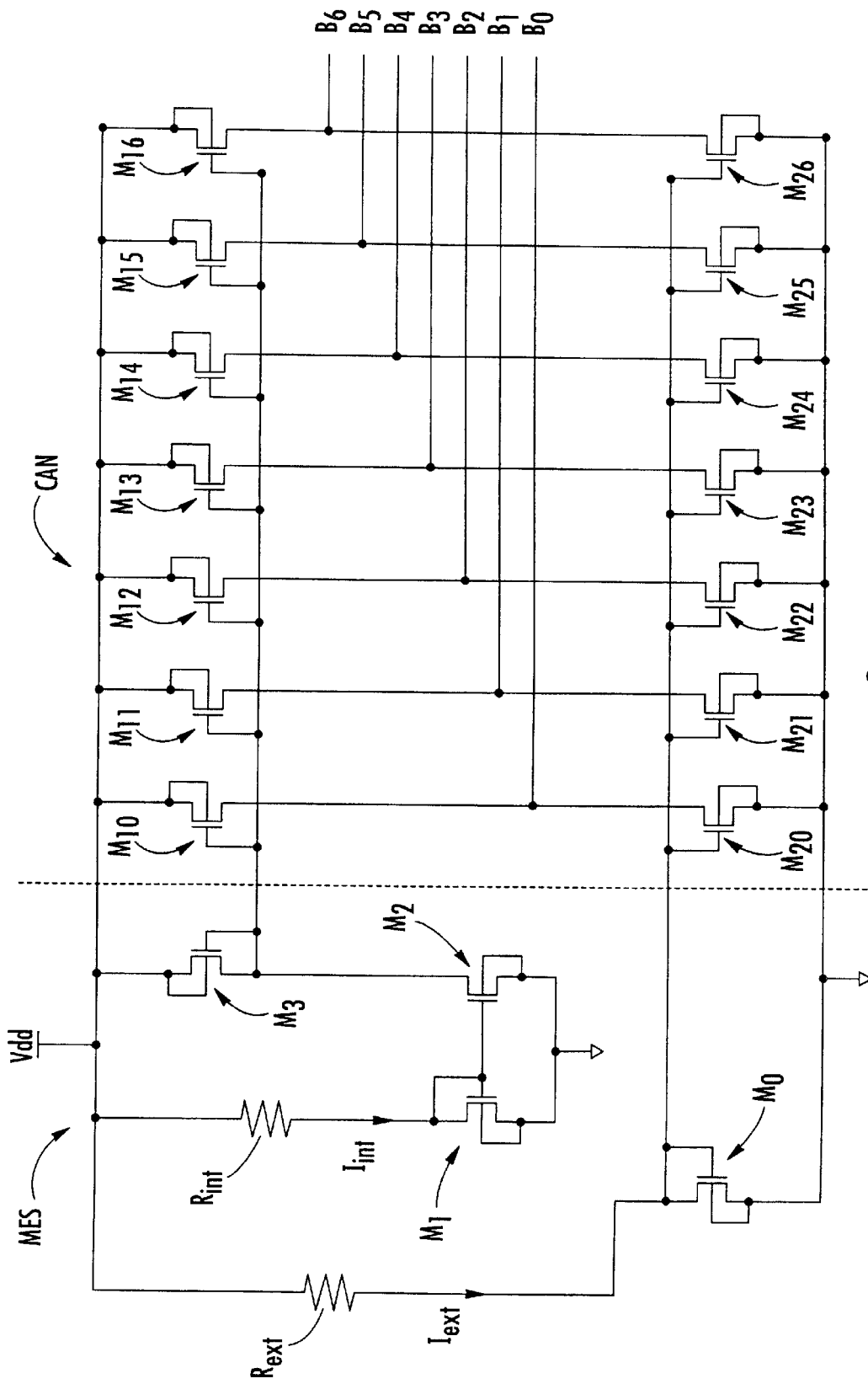
FIG. 2 is a schematic diagram illustrating all the connections and components forming the compensation cell illustrated in FIG. 1.

Each compensated resistor has as many parallel-connected resistors as there are bits forming the compensation code. In the example of FIG. 2 developed further below in the description, the compensation code has seven bits. A compensated resistor according to this example therefore includes a nominal resistor and seven parallel-connected resistors. Nevertheless, depending on the desired precision, the compensation code may comprise a smaller or greater number of bits.

Advantageously, the nominal resistor is oversized with respect to the expected value of the resistor so that, in the worst case, this nominal resistor has a value of resistivity equal to what is expected. In all the other cases, all or part of the parallel resistors are made conductive to lower the value of the total resistance to the expected value.

The measurement resistor 4 must have the same value as the reference resistor 3. According to another major characteristic of the invention, the measurement resistor 4 must also be designed identically to the nominal part of each of the compensated resistors 5a, 5b and 5c. Thus, a variation in the value of resistance on the nominal part of an integrated resistor of the circuit will recur in the same way at the measurement resistor. In other words, the measurement resistor is the image of the resistors of the circuit.

However, in one particular embodiment, a ratio between the nominal part of compensated resistor and the measurement resistor may be applied. The measurement resistor is then designed in a form where the ratio between it and the nominal part of the compensation resistor is equal to an integer number n, with n>1. There is then the same ratio between the nominal part of the compensated resistor and the reference resistor.

Thus, the variations in resistance of the nominal part, relative to this nominal value, will be the same as the variations in the value of the measurement resistor relative to the reference resistor. Rational and differing ratios may therefore be applied between the measurement resistor and the nominal part of each compensated resistor.

Introducing a ratio between the nominal part of the compensated resistor and the measurement resistor gives compensated resistors of relatively low resistance, for example, 50 ohms or 100 ohms, while limiting the consumption of current that will flow through the reference and measurement resistors.

It is furthermore necessary that, in each compensated resistor 5a, 5b and 5c, the correction resistors added to or deducted from the nominal part are adapted to the value of the nominal part. In each compensated resistor, the ratio between a given corrective term associated with a given bit of the compensation code and the nominal resistor should therefore be the same from one compensated resistor to another. This should be the case for each corrective term. The overall value of a compensated resistor may vary from one to another but the ratios between the corrective terms and then nominal resistance should be constant.

Thus, the same compensation code may be used with the same relative precision for several compensated resistor values. Furthermore, the system according to the invention compensates for the variations in the value of the nominal resistor using non-ideal resistors. It is therefore relatively necessary to keep a high ratio between the values of the correction resistors and the value of the nominal resistor. In this case, the value of the nominal resistor must be far below those of the correction resistors.

An example to illustrate the above-described recommendations relating to the constraints of the ratio between the measurement resistor, the reference resistor and the compensated resistors will now be described. Two integrated resistors R1 and R2 are to be used in this example. Their nominal value is respectively Rn1 and Rn2, with Rn2=k*Rn1. Their real values are R1 and R2.

For reasons of power consumption, the value of the measurement resistor and of the reference resistor must be far higher than the nominal values Rn1 or Rn2. The following value is then chosen:

$$Rmeasurement = Rreference = K*Rn1.$$

In this case, the compensation code delivered by the compensation cell 2 is always the image of the ratio of the value of the measurement resistor to the value of the reference resistor and is equal to:

$$Rmeasurement/Rreference=1$$

A variation of resistance $\Delta r$ in the nominal value Rn1 has repercussions in the form of $k*\Delta r$ on the value Rn2 and $K*\Delta r$ on the value Rmeasurement of the measurement resistor. Thus, the compensation code is equal to $1+(K*\Delta r/Rmeasurement)$, or else equal to $1+(k*\Delta r/Rn2)$, or else again equal to $1+(\Delta r/Rn1)$.

This value of the compensation code may lead, for example, to the determination of a corrective term (among n available terms) from each of the compensated resistors. This means that, to keep the first value of the compensated resistor R1 equal to its nominal value Rn1, it is necessary to deduct the corrective term Rc11, so that:

$$R1-Rc11=Rn1, \text{ namely } Rc11=\Delta r$$

Since the compensation code is distributed identically to all the resistors, a same-order corrective term is also removed from R2. Thus, we have to apply this corrective term Rc21, so that:

$$R2-Rc21=Rn2, \text{ which amounts to writing:}$$

$$Rc21=k*\Delta r$$

We thus find the same ratio k between the same-order corrective terms of the compensated resistors:

$$Rc21=k*Rc11$$

The same principle can be applied to all the corrective terms so that:

$$Rc22=k*Rc12$$

$$Rc23=k*Rc13, \text{ and to generalize:}$$

$$Rc2i=k*Rc1i$$

By way of a conclusion of this example, it is clear that the same compensation code can be used for different values of compensated resistors, provided that an equal ratio is kept between the nominal parts of each integrated resistor and between the same-order corrective terms.

The circuitry used by the compensation cell 2 therefore has the role of fabricating the compensation code, conveying it and using it without disturbing the ratios of magnitude. FIG. 2 illustrates the circuitry implemented in the compensation cell 2 of FIG. 1 acting as a comparison device between two resistors.

The compensation cell 2 according to the invention is designed to generate a seven-bit code in the example shown herein. The number of bits implemented in the compensation code depends on the desired precision. The code generated by the cell reflects the ratio of the values of the resistors Rmeasurement and Rreference. The reference resistor is a resistor external to the package, while the measurement resistor is an internal resistor that is a close reflection of the integrated resistors to be compensated for. The digital compensation code is constantly re-updated, i.e., it progresses in time, for example, because of a change in temperature.

The part to the left of the dashed line in the circuit of FIG. 2, hereinafter called a measurement circuit MES, makes a purely analog comparison between the measurement resistor referenced Rint and the reference resistor referenced Rext. The two resistors Rint and Rext are powered by the power supply Vdd.

As we have already seen above, the comparison device uses only analog information carried by currents. The comparison between the two resistors Rint and Rext is therefore expressed in the form of a ratio of currents that is the image of the ratio of the resistors Rext and Rint.

The left-hand part of the drawing, labeled MES, is used to tap a current Iint from the resistor Rint by the diode-mounted N-type MOS transistor M1, and a current Iext from the resistor Rext by the diode-mounted N-type MOS transistor M0. The diode-mounted transistors M0 and M1 respectively enable the extraction of these two currents from the resistors Rext and Rint. These transistors also make it possible to copy these two currents to the right-hand part of the compensation cell. For this purpose, the transistors M0 and M1 have the same dimensions, and are also designed side by side and with the same orientation.

The temperature variation especially modifies the characteristics of the diodes M0 and M1 enabling the recovery of the currents Iint and Iext, and therefore the values of the currents recovered Iint and Iext also vary with the temperature. It is therefore important that the diodes M0 and M1 should each have the same characteristic so as to copy the currents with a same ratio.

Similarly, passive parasitic elements (not shown), for example, electrostatic discharge (ESD) protection resistors may also be planned in a series connection with the resistors Rint and Rext, provided that they are identical.

As for the part of the circuit located to the right of the dashed line, hereinafter called a parallel ADC converter, its role is to convert the current ratio Iint/Iext into a seven-bit digital code which is the image of the ratio between the values of the resistors Rext and Rint, corresponding to a known level of temperature and of manufacturing quality that has been predetermined in simulation for a ratio such as this between the values of Rext and Rint.

The parallel analog-digital converter ADC comprises a first group of P-channel MOS transistors, respectively M10 to M16, parallel-connected between a power supply terminal Vdd and the output terminals, respectively B0 to B6, and a second group of N-channel MOS transistors M20 to M26 parallel-connected between ground and the output terminals, respectively B0 to B6. Iext is directed towards the N-type transistors M20 to M26 by the N-type transistor M0, while Iint is directed towards the P-type transistors by the N-type transistor M1 and by the P-type transistors M2 and M3.

The transistors M10 and M20 are respectively associated with the node B0, the transistors M11 and M21 are respectively associated with the node B1, etc. The transistor M10 tries to copy the current Iint downwards while the transistor M20 tries to copy the current Iext upwards.

As soon as the transistor M10 tries to copy a current stronger than what the transistor M20 associated with it is trying to copy, the node B0 switches from 0 to 1. The ratio between the strengths of the currents are therefore converted into voltage levels at the node. This operation is then repeated for each of the following nodes B1 to B6.

The digital code produced is therefore a thermometer type code, namely 0000000, then 0000001, then 0000011, then 0000111 . . . up to 1111111. The function that links this digital code to the ratio of the value of the currents Iint/Iext is defined by the dimensions of the P-type copies M10 to M16.

Thus, for a given current ratio, which is the image of the ratio between the respective value of the resistors Rext and Rint, it is decided, for example, to produce a digital code equal to 5. The setting of the P-type transistor corresponding to the bit 5, namely M15, is then looked at and this setting is increased or reduced so as to modify its copying ratio with the P-type transistor M3 which gives the current Iint to the P-type copies M10 to M16. In this way, for each bit, by bringing into play the relation between (a) the dimensions of the P-type transistors M10 to M16 active in the copy of the upper part of the circuit as seen in the drawing, and (b) the dimension of the transistor M3, the function that relates the digital code to the ratio of the values of the resistors Rext and Rint is precisely determined.

The value of the ADC therefore is based upon its capacity for current division and digitization in the same operation. It will be seen below that another function is necessary. The left-hand part of the MES circuit, which has the task of giving the converter a current ratio that is the image of the ratio of the values of the resistors Rext/Rint, operates as follows with reference to FIG. 3.

There is a constant-value resistor Rext available that must be compared with the resistor Rint. The values of the voltages to which the resistors are subjected are not controlled, and especially the voltage Uint is subjected to variation. In other words, no voltage reference is implemented. However, the structure to the right of the circuit overcomes the imprecision introduced by the voltage difference. Thus, it is known that an error is committed in making a comparison with non-identical voltages, but this error is corrected subsequently in the analog-digital conversion circuit.

Figure 3:
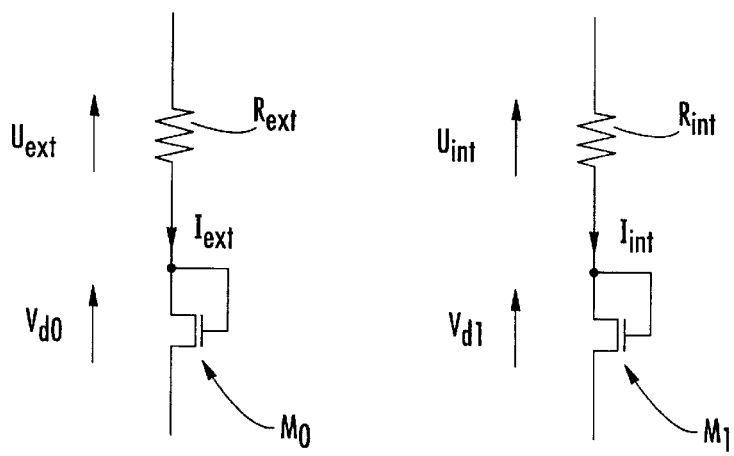
FIG. 3 is a schematic diagram of the two arms of the measurement circuit implemented in the compensation cell according to the present invention.

In the two arms shown in FIG. 3, only the value of the resistor Rext is a constant and known magnitude. We have:

$Iint/Iext=(Rext/Rint)*(Uint/Uext)$, or again:

$$Iint/Iext=(Rext/Rint)*(1+/-\Delta U/U) \quad (1)$$

In the ideal case, with a voltage reference and where Uint is equal to Uext, the ratio of the currents is directly equal to the ratio of the resistors. The information given by the left-hand part of the circuit is then exact.

However, in the present case, where the values of the voltages Uint and Uext are not controlled, the coefficient Uint/Uext is not constant. This has the consequence of introducing an error into the function linking the ratio of the resistors to the ratio of the currents.

The current Iint is taken in order to be copied by the diode-mounted transistor M1. A variation in the value of the internal resistor Rint (due to the quality of manufacture of the integrated resistor or due to the temperature) therefore gives rise to a variation in the current Int. This prompts a variation in the voltage Vd1 of the diode crossed by this current. A variation in the diode voltage Vd1 is now expressed by the opposite variation in the voltage Uint. Any variation in the ratio of Uint to Uext is therefore due to a variation in the ratio Iint/Iext. The expression (1) can therefore be written as follows:

$$Iint/Iext=Rext/Rint*f(Iint/Iext) \quad (2)$$

The function f(Iint/Iext) depends solely on the ratio Iint/Iext, regardless of the cause of the variation in the ratio Iint/Iext. That is, the function is due either to the quality of manufacture of the integrated resistor or to the variation in temperature of the circuit in operation. Thus, it matters little whether the error is due to the quality of manufacture or to the temperature. The same correction system will be applied once information is available on the ratio of the currents Iint/Iext.

Nonetheless, simulation results of the variation of the ratio Iint/Iext with respect to the variation of the ratio Rext/Rint show a slight deviation of the curve plotted at a variable temperature (not shown). This slight deviation is eliminated by increasing the dimensions of the transistors M0 and M1, so as to make them work far from the flexion point or bend of the diode characteristic.

The error in the function linking the ratio of the resistors to the ratio of the currents is therefore itself a function that depends on the ratio of currents, as can be seen in the expression (2). The ratio of currents Iint/Iext is precisely the information extracted from the measurement circuit located to the left of the dashed line of the compensation cell.

This information will be used to subsequently generate an error correction coefficient by which the error can be cancelled. The idea therefore is to generate, further down in the circuitry of the compensation cell, the inverse function of the function f(Iint/Iext) enabling the cancellation of the error on the measurement of the ratio Iint/Iext which must be the most exact image of the ratio of the values of the resistors Rext/Rint.

Figure 4:
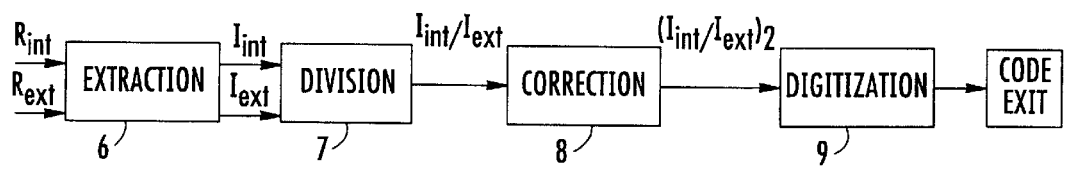
FIG. 4 is a block diagram of the compensation cell according to the present invention.

FIG. 4 shows a block diagram of the compensation cell illustrating the main functions that it implements. Thus, at a first stage, the measurement circuit in the compensation cell fulfils a function 6 of tapping the currents Iint and Iext that flow respectively through the resistors Rint and Rext.

The parallel converter of the compensation cell is provided with a division function 7 which is then used to divide the incoming currents and gives the ratio Iint/Iext, which is the image of the ratio of the value of the resistors Rext/Rint, with the addition of an error (Iint/Iext) also depending on the ratio of the currents Iint/Iext, as explained above.

Then, the means with which the parallel converter is provided implement an error correction function 8 whose aim is to give a coefficient Q such that:

$$Q=f^{-1}(Iint/Iext)$$

Thus, a new ratio of currents $(Iint/Iext)_2$ is obtained, and this new ratio of currents is corrected this time:

ti $(Iint/Iext)_2=Rext/Rint*f(Iint/Iext)*Q=Rext/Rint$

The information $(Iint/Iext)_2$ is therefore the direct image of the ratio of resistors. What remains is to digitize this information to obtain the output code. To do this, a digitization function 9 is implemented in the parallel converter. The digitization function linking this input ratio of currents $(Iint/Iext)_2$ to the output code as well as the correction function $f^{-1}(Iint/Iext)$ are defined in the parallel converter by working on the dimensions of the PMOS type transistors M10 to M16, as seen above with reference to FIG. 2.

The parallel converter of the compensation cell therefore provides for three distinct functions brought together in the same circuit part: the division of the currents, the application of a corrective function to an error generated previously in the circuitry and the digitization of the information obtained. All these three functions are fulfilled by the present invention in a straightforward and precise way with very little space requirement and with low power consumption.

The resistor comparison device according to the invention can thus be used to implement a system for the active correction of the value of integrated resistors on the basis of a precise external resistor used as a reference. The system therefore uses a single control circuit that is valid for several compensated resistors which may have different values. Furthermore, since the compensation information is conveyed in digital form to the different compensated resistors, it is made insensitive to the different noises.

That which is claimed is:

1. A device for comparing two resistors and comprising:
    a measurement circuit connected to the two resistors for extracting a respective current being conducted through each resistor and for copying the extracted currents; and
    a parallel analog-digital converter connected to said measurement circuit for receiving the copy of the extracted currents therefrom, said parallel analog-digital converter for dividing the copy of the extracted currents and converting a ratio thereof into a digital code corresponding to a ratio of resistive values of the two resistors, the digital code being updated as a function of at least one environmental parameter of a circuit incorporating one of the resistors;
    the two resistors being compared without using a voltage reference and by using analog information provided by the extracted currents.

2. A device according to claim 1, wherein the at least one environmental parameter comprises an operating temperature of the circuit.

3. A device according to claim 1, wherein said measurement circuit comprises a first MOS transistor and a second MOS transistor for extracting and copying the respective currents, said first and second MOS transistors having a same type of conductivity and each MOS transistor is configured as a diode.

4. A device according to claim 3, wherein said first and second MOS transistors have substantially identical dimensions so that each MOS transistor has the same diode characteristics.

5. A device according to claim 1, wherein said parallel analog-digital converter comprises:
    a plurality of output terminals;
    a first group of P-channel MOS transistors parallel-connected between a first voltage reference and said plurality of output terminals; and
    a second group of N-channel MOS transistors parallel-connected between a second voltage reference and said plurality of output terminals;
    said first and second groups of MOS transistors for dividing the copy of the extracted currents and for converting the ratio thereof into the digital code.

6. A device according to claim 5, wherein dimensions of said first group of P-channel MOS transistors links the digital code to the ratio of the extracted currents.

7. A device according to claim 1, wherein said parallel analog-digital converter further performs an error correction function for generating a coefficient for correcting an error occurring in a function that links the ratio of the extracted currents to the ratio of the resistive values of the two resistors due to the absence of the voltage reference so that the ratio of the extracted currents is an image of the ratio of the resistive values of the two resistors.

8. A device according to claim 1, further comprising a respective passive parasitic element series-connected with each resistor, each passive parasitic element being substantially identical to each other.

9. A device according to claim 8, wherein each passive parasitic element comprises an electrostatic discharge protection resistor.

10. A device for comparing resistive values of two resistors and comprising:
    a measurement circuit connected to the two resistors for extracting a respective current being conducted through each resistor; and
    a parallel analog-digital converter connected to said measurement circuit for receiving a copy of the extracted currents therefrom, said parallel analog-digital converter for dividing the copy of the extracted currents and converting a ratio thereof into a digital code corresponding to a ratio of the resistive values of the two resistors, the digital code being updated as a function of at least one environmental parameter of a circuit incorporating one of the resistors.

11. A device according to claim 10, wherein the at least one environmental parameter comprises an operating temperature of the circuit.

12. A device according to claim 10, wherein said measurement circuit comprises a first MOS transistor and a second MOS transistor for extracting and copying the respective currents, said first and second MOS transistors having a same type of conductivity and each MOS transistor is configured as a diode.

13. A device according to claim 12, wherein said first and second MOS transistors have substantially identical dimensions so that each MOS transistor has the same diode characteristics.

14. A device according to claim 10, wherein said parallel analog-digital converter comprises:
    a plurality of output terminals;
    a first group of P-channel MOS transistors parallel-connected between a first voltage reference and said plurality of output terminals; and
    a second group of N-channel MOS transistors parallel-connected between a second voltage reference and said plurality of output terminals;
    said first and second groups of MOS transistors for dividing the copy of the extracted currents and for converting the ratio thereof into the digital code.

15. A device according to claim 14, wherein dimensions of said first group of P-channel MOS transistors links the digital code to the ratio of the extracted currents.

16. A device according to claim 10, wherein said parallel analog-digital converter further performs an error correction function for generating a coefficient for correcting an error occurring in a function that links the ratio of the extracted currents to the ratio of the resistive values of the two resistors due to the absence of a voltage reference so that the ratio of the extracted currents is an image of the ratio of the resistive values of the two resistors.

17. A device according to claim 10, further comprising a respective passive parasitic element series-connected with each resistor, each passive parasitic element being substantially identical to each other.

18. A device according to claim 17, wherein each passive parasitic element comprises an electrostatic discharge protection resistor.

19. A system for actively correcting resistive values of a plurality of compensation resistors integrated into a package using an external reference resistor, said system comprising:
    an internal measurement resistor;
    a comparison device connected to said internal measurement resistor and to the external reference resistor for comparing resistive values of the two resistors, said comparison device comprising
        a measurement circuit for extracting a respective current being conducted through each resistor, and
        a parallel analog-digital converter connected to said measurement circuit for receiving a copy of the extracted currents therefrom, said parallel analog-digital converter for dividing the copy of the extracted currents and converting a ratio thereof into a digital code corresponding to a ratio of the resistive values of the two resistors, the digital code being updated as a function of at least one environmental parameter of said internal measurement resistor; and a plurality of compensation resistors connected to said comparison device, each compensation resistor comprising a nominal resistor and a plurality of parallel-connected correction resistors, each nominal resistor having a resistive value corresponding to a resistive value of said internal measurement resistor based upon a ratio therebetween, and said plurality of parallel-connected correction resistors being individually put into operation or into an off state as a function of the digital code for providing a resistive value of a desired compensation resistor.

20. A system according to claim 19, wherein said internal measurement resistor and said external reference resistor are compared without using a voltage reference.

21. A system according to claim 19, wherein said plurality of compensation resistors have different resistive values and are subject to variations caused by an operating temperature and by a quality of manufacture of resistors of this type.

22. A system according to claim 19, wherein a number of said plurality of parallel-connected correction resistors for each compensation resistor is equal to a number of bits forming the digital code.

23. A system according to claim 19, wherein said measurement circuit comprises a first MOS transistor and a second MOS transistor for extracting and copying the respective currents, said first and second MOS transistors having a same type of conductivity and each MOS transistor is configured as a diode.

24. A system according to claim 23, wherein said first and second MOS transistors have substantially identical dimensions so that each MOS transistor has the same diode characteristics.

25. A system according to claim 19, wherein said parallel analog-digital converter comprises:

a plurality of output terminals;

a first group of P-channel MOS transistors parallel-connected between a first voltage reference and said plurality of output terminals; and a second group of N-channel MOS transistors parallel-connected between a second voltage reference and said plurality of output terminals;

said first and second groups of MOS transistors for dividing the copy of the extracted currents and for converting the ratio thereof into the digital code.

26. A system according to claim 25, wherein dimensions of said first group of P-channel MOS transistors links the digital code to the ratio of the extracted currents.

27. A system according to claim 19, wherein said parallel analog-digital converter further performs an error correction function for generating a coefficient for correcting an error occurring in a function that links the ratio of the extracted currents to the ratio of the resistive values of the two resistors due to an absence of a voltage reference so that the ratio of the extracted currents is an image of the ratio of the resistive values of the two resistors.

28. A system according to claim 19, further comprising a respective passive parasitic element series-connected with said internal measurement resistor and said external reference resistor, each passive parasitic element being substantially identical to each other.

29. A system according to claim 28, wherein each passive parasitic element comprises an electrostatic discharge protection resistor.

30. A method for comparing two resistors and comprising:

extracting a respective current being conducted through each resistor;

copying the extracted currents to a parallel analog-digital converter;

dividing the copy of the extracted currents and converting a ratio thereof into a digital code corresponding to a ratio of resistive values of the two resistors; and updating the digital code as a function of at least one environmental parameter of a circuit incorporating one of the resistors.

31. A method according to claim 30, wherein the at least one environmental parameter comprises an operating temperature of the circuit.

32. A method according to claim 30, wherein the extracting and copying is performed using a measurement circuit connected to the two resistors; and wherein the measurement circuit comprises a first MOS transistor and a second MOS transistor for extracting and copying the respective currents, the first and second MOS transistors have a same type of conductivity and each MOS transistor being configured as a diode.

33. A method according to claim 32, wherein the first and second MOS transistors have substantially identical dimensions so that each MOS transistor has the same diode characteristics.

34. A method according to claim 30, wherein the dividing and updating is performed using a parallel analog-digital converter comprising:

a plurality of output terminals;

a first group of P-channel MOS transistors parallel-connected between a first voltage reference and the plurality of output terminals; and a second group of N-channel MOS transistors parallel-connected between a second voltage reference and the plurality of output terminals;

the first and second groups of MOS transistors for dividing the copy of the extracted currents and for converting the ratio thereof into the digital code.

35. A method according to claim 34, wherein dimensions of the first group of P-channel MOS transistors links the digital code to the ratio of the extracted currents.

36. A method according to claim 34, wherein the parallel analog-digital converter further performs an error correction function for generating a coefficient for correcting an error occurring in a function that links the ratio of the extracted currents to the ratio of the resistive values of the two resistors due to the absence of the voltage reference so that the ratio of the extracted currents is an image of the ratio of the resistive values of the two resistors.

37. A method according to claim 30, wherein a respective passive parasitic element is series-connected with each resistor, each passive parasitic element is substantially identical to each other.

* * * * *

UNITED STATES PATENT AND TRADEMARK OFFICE
CERTIFICATE OF CORRECTION

PATENT NO. : 6,791,340 B2
DATED : September 14, 2004
INVENTOR(S) : Frédéric Hasbani It is certified that error appears in the above-identified patent and that said Letters Patent is hereby corrected as shown below:

Title page,
Item [75], Inventors, delete "Laval" insert -- Crolles --

Column 8,
Line 40, delete "ti"

Signed and Sealed this

Eighth Day of March, 2005

JON W. DUDAS
*Director of the United States Patent and Trademark Office*